(12) United States Patent
Chien et al.

(10) Patent No.: US 7,763,972 B2
(45) Date of Patent: Jul. 27, 2010

(54) STACKED PACKAGE STRUCTURE FOR REDUCING PACKAGE VOLUME OF AN ACOUSTIC MICRO-SENSOR

(75) Inventors: Hsin-Tang Chien, Yilan County (TW); Chieh-Ling Hsiao, Taichung County (TW); Chin-Hung Wang, Hsinchu (TW)

(73) Assignee: Industrial Technology Research Institute, Hsin-Chu (TW)

( * ) Notice: Subject to any disclaimer, the term of this patent is extended or adjusted under 35 U.S.C. 154(b) by 252 days.

(21) Appl. No.: 12/119,551

(22) Filed: May 13, 2008

(65) Prior Publication Data

US 2009/0057876 A1   Mar. 5, 2009

(30) Foreign Application Priority Data

Aug. 28, 2007   (TW) .............................. 96131766 A

(51) Int. Cl.
*H01L 23/12* (2006.01)

(52) U.S. Cl. ..................... 257/704; 257/678; 257/730; 257/666; 257/E25.006; 257/E25.021; 257/E25.027; 257/E23.085

(58) Field of Classification Search ......... 257/245–254, 257/414–422, 678–733, E23.001–E23.194, 257/777, E25.005, E25.006, E25.021, E25.027, 257/E23.085, 924; 438/109, FOR. 368, FOR. 426
See application file for complete search history.

(56) References Cited

U.S. PATENT DOCUMENTS

| | | | |
|---|---|---|---|
| 6,015,722 A * | 1/2000 | Banks et al. | 438/108 |
| 6,178,249 B1 | 1/2001 | Hietanen et al. | |
| 6,600,231 B2 * | 7/2003 | Tominaga | 257/778 |
| 6,781,231 B2 | 8/2004 | Minervini | |
| 7,173,324 B2 * | 2/2007 | Lee et al. | 257/684 |
| 2002/0180032 A1 * | 12/2002 | Sun et al. | 257/704 |
| 2005/0185812 A1 | 8/2005 | Minervini | |
| 2007/0013052 A1 * | 1/2007 | Zhe et al. | 257/704 |
| 2008/0157301 A1 * | 7/2008 | Ramakrishna et al. | 257/676 |

* cited by examiner

*Primary Examiner*—Jasmine J Clark
(74) *Attorney, Agent, or Firm*—WPAT, PC; Justin King

(57) ABSTRACT

A stacked package structure utilizes flip-chip technology to stack an acoustic micro-sensor on an integrated circuit (IC) device having a recess as a back chamber and cover the acoustic micro-sensor using a glass substrate or a planar substrate with an aperture. With the use of the stacked package structure, the package volume of the acoustic micro-sensor can be reduced effectively.

18 Claims, 5 Drawing Sheets

STACKED PACKAGE STRUCTURE FOR REDUCING PACKAGE VOLUME OF AN ACOUSTIC MICRO-SENSOR

BACKGROUND OF THE INVENTION

1. Field of the Invention

The present invention generally relates to a stacked package structure for reducing the package volume of an acoustic micro-sensor.

2. Description of the Prior Art

Packaging of an acoustic micro-sensor made by Micro-Electro-Mechanical Systems (MEMS) has been a key issue. Conventionally, wire bonding is used to connect an IC device and an acoustic micro-sensor.

In U.S. Pat. No. 6,781,231 "Microelectromechanical System Package with Environmental and Interference Shield" as shown in FIG. 1, surface mounted devices (SMD's) 12, 14, 16 such as an IC device and an acoustic micro-sensor are mounted on a substrate 18 and are connected by wire bonding. In FIG. 1, the package volume is very large because the IC device and the acoustic micro-sensor are connected by wire bonding.

In U.S. Pat. Appl. No. 2005/0185812 "Miniature Silicon Condenser Microphone and Method for Producing the Same" as shown in FIG. 2, an IC device 22 and an acoustic micro-sensor 24 are surface-mounted on a substrate 26. A recess as a back chamber 28 is formed on the substrate 26 corresponding to a position whereon the acoustic micro-sensor 24 is formed. Therefore, the noise generated due to the vibration of the sensing thin film of the acoustic micro-sensor is reduced. However, in this patent, the substrate is recessed because the IC device and the acoustic micro-sensor occupy the area on the substrate. Therefore, the package volume is large and the manufacturing is complicated.

In U.S. Pat. No. 6,178,249 "Attachment of a Micromechanical Microphone" as shown in FIG. 3, flip-chip technology is used to form an acoustic micro-sensor 32 on an IC device 34 and a back chamber 38 enveloped by an insulating ring 36 between the acoustic micro-sensor 32 and the IC device 34 so as to reduce noise generated due to the vibration of the sensing thin film of the acoustic micro-sensor. However, in this patent, a back chamber 38 is required. Therefore, the package volume is large.

Accordingly, there is need in providing a stacked package structure for reducing the package volume of an acoustic micro-sensor using flip-chip technology to stack an acoustic micro-sensor on an integrated circuit (IC) device having a recess as a back chamber and cover the acoustic micro-sensor using a glass substrate or a planar substrate with an aperture so as to reduce the package volume of the acoustic micro-sensor.

SUMMARY OF THE INVENTION

The present invention provides a stacked package structure for reducing the package volume of an acoustic micro-sensor, using flip-chip technology to stack an acoustic micro-sensor on an integrated circuit (IC) device so as to reduce the package volume of the acoustic micro-sensor and increase the manufacturing yield.

The present invention provides a stacked package structure for reducing the package volume of an acoustic micro-sensor, using a recess as a back chamber of an IC device so as to reduce the package volume of the acoustic micro-sensor.

The present invention provides a stacked package structure for reducing the package volume of an acoustic micro-sensor, using flip-chip technology to stack an acoustic micro-sensor on an IC device having a recess as a back chamber and cover the acoustic micro-sensor using a glass substrate or a planar substrate with an aperture so as to reduce the package volume of the acoustic micro-sensor.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE PREFERRED EMBODIMENT

The present invention can be exemplified by but not limited to the preferred embodiments as described hereinafter.

Figure 1:
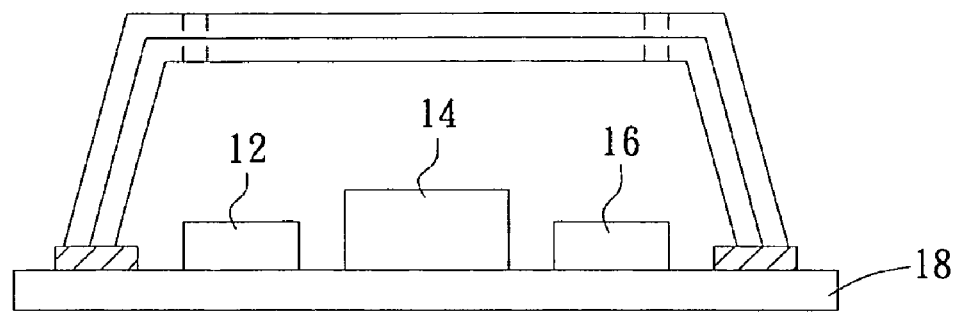
FIG. 1 is a cross-sectional diagram of a conventional package structure of an acoustic micro-sensor.
Figure 2:
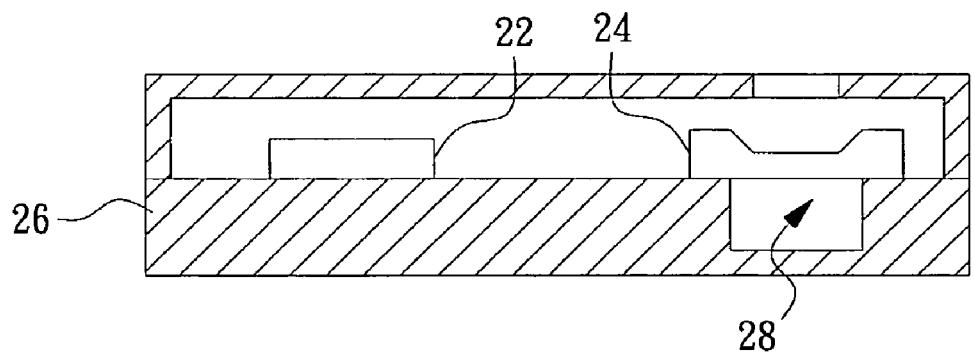
FIG. 2 is a cross-sectional diagram of another conventional package structure of an acoustic micro-sensor.
Figure 3:
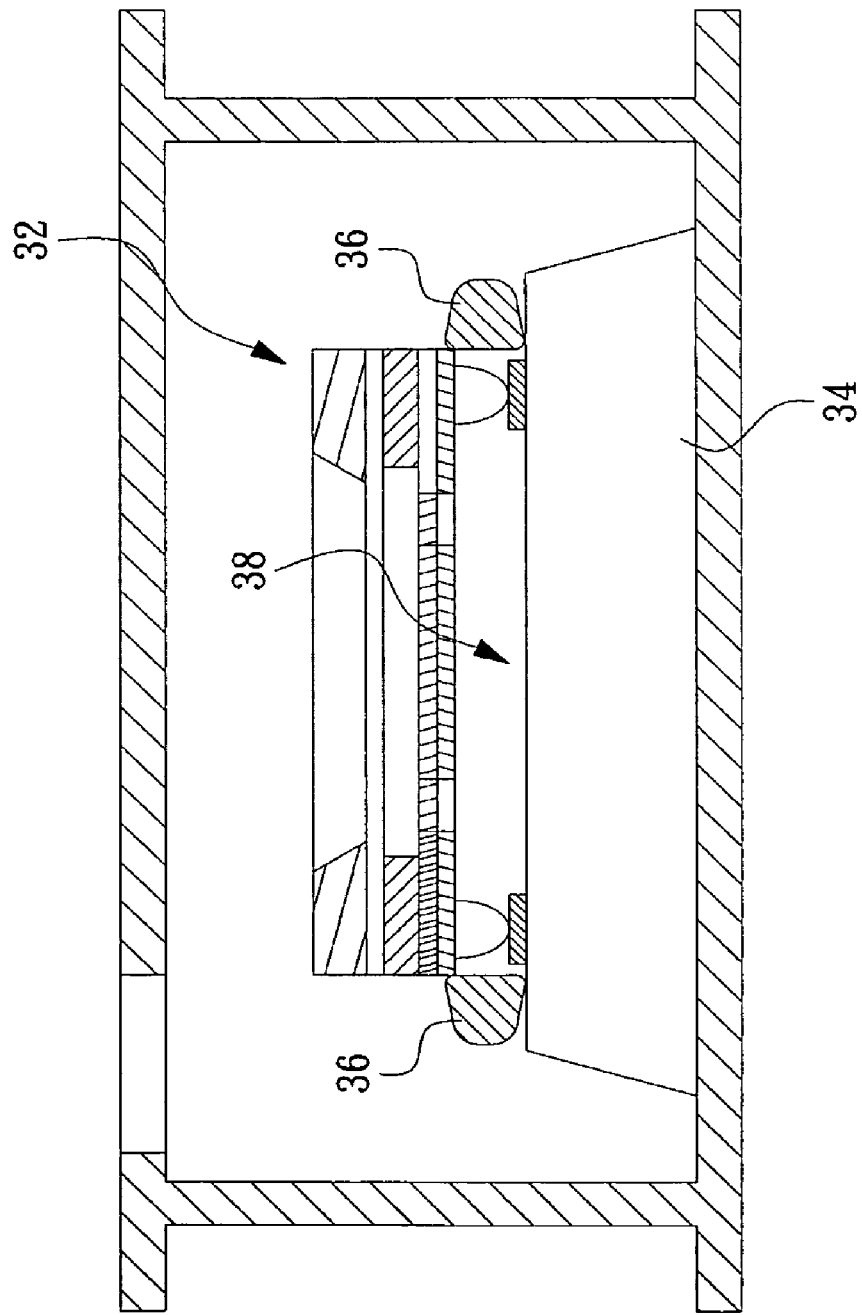
FIG. 3 is a cross-sectional diagram of still another conventional package structure of an acoustic micro-sensor.
Figure 4:
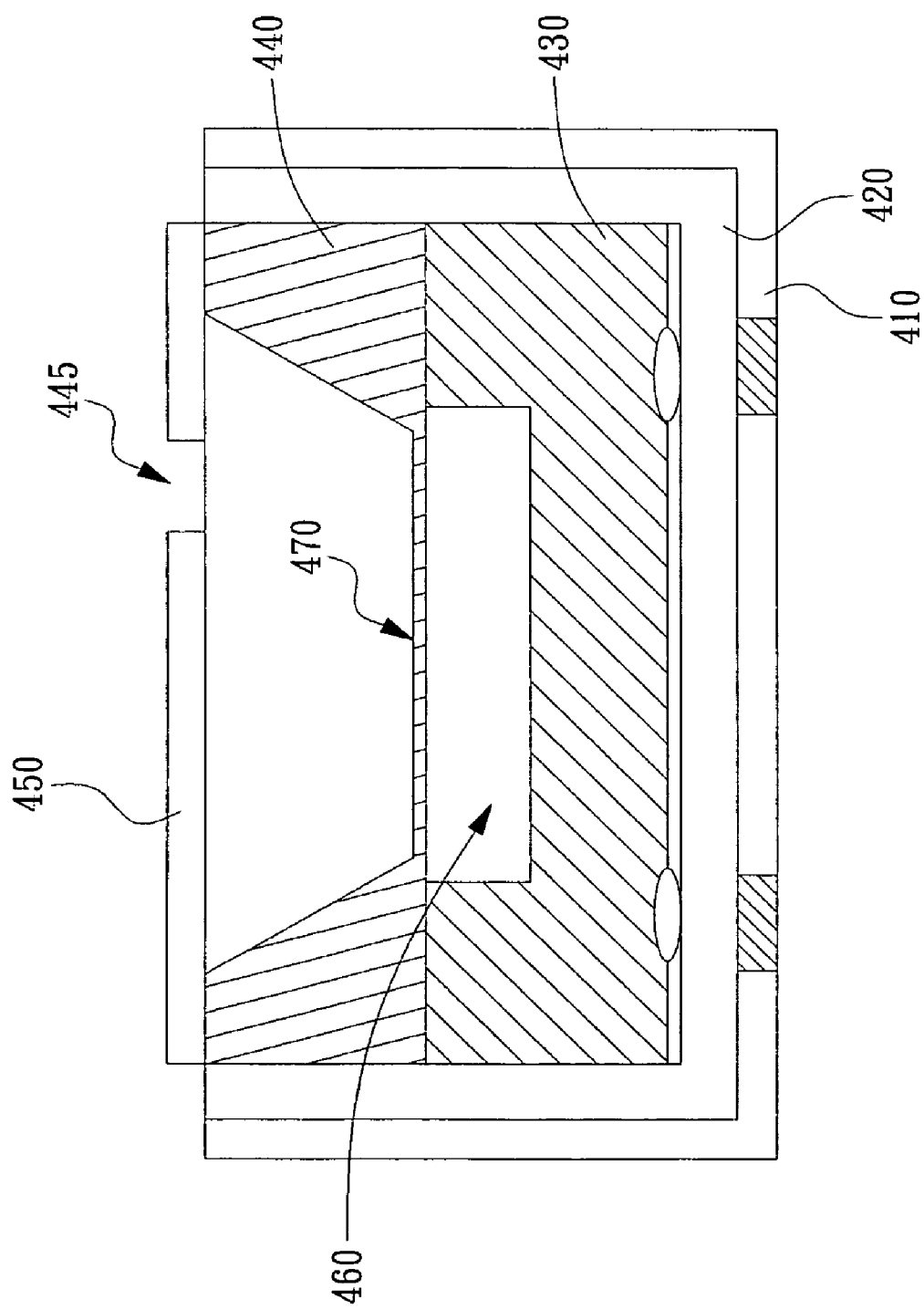
FIG. 4 is a cross-sectional diagram of a stacked package structure for reducing the package volume of an acoustic micro-sensor according to a first embodiment of the present invention.

Please refer to FIG. 4, which is a cross-sectional diagram of a stacked package structure for reducing the package volume of an acoustic micro-sensor according to a first embodiment of the present invention. In FIG. 4, a recessed conductive substrate 420 is formed on a recessed protective substrate 410. An IC device 430 is connected to the conductive substrate 420. An acoustic micro-sensor 440 is stacked on the IC device 430. The acoustic micro-sensor 440 is covered by a lid 450 with a tone hole 445. The IC device 430 is designed to have a recess 460 as a back chamber for the acoustic micro-sensor 440 so as to reduce noise generated due to the vibration of a sensing thin film 470 of the acoustic micro-sensor 440. In the present embodiment, the acoustic micro-sensor is stacked on the IC device having a recess as a back chamber for the acoustic micro-sensor so as to reduce the package volume of the acoustic micro-sensor and increase the manufacturing yield.

Figure 5:
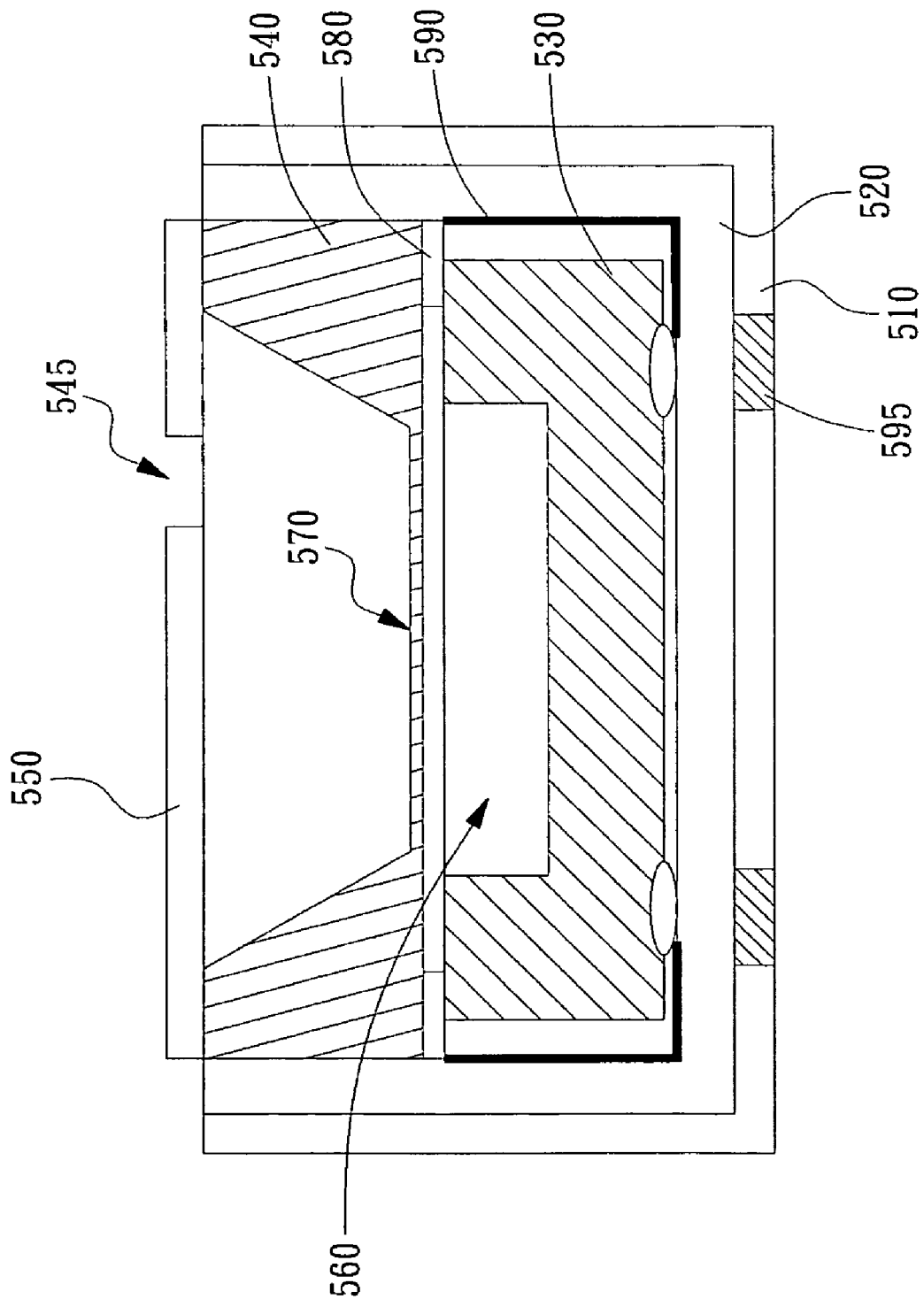
FIG. 5 is a cross-sectional diagram of a stacked package structure for reducing the package volume of an acoustic micro-sensor according to a second embodiment of the present invention.

Please refer to FIG. 5, which is a cross-sectional diagram of a stacked package structure for reducing the package volume of an acoustic micro-sensor according to a second embodiment of the present invention. In FIG. 5, a recessed conductive substrate 520 is formed on a recessed protective substrate 510. An IC device 530 is connected to the conductive substrate 520. An acoustic micro-sensor 540 is stacked on the IC device 530. The acoustic micro-sensor 540 is covered by a lid 550 with a tone hole 545. The IC device 530 is designed to have a recess 560 as a back chamber for the acoustic micro-sensor 540 so as to reduce noise generated due to the vibration of a sensing thin film 570 of the acoustic micro-sensor 540. In the present embodiment, a conductive frame 580 between the IC device 530 and the acoustic micro-sensor 540 is formed on the sidewall of the conductive substrate 520 to define the height and the volume of the back chamber and to electrically connect the acoustic micro-sensor 540 and a conductive wire 590 on the conductive substrate 520. The acoustic micro-sensor 540 is first electrically connected to the IC device 530 to amplify the signal from the acoustic micro-sensor 540. The amplified signal is then transmitted through the conductive wire 590 to the conductive substrate 520, the output 595 and the system circuit board. In the present embodiment, the acoustic micro-sensor is stacked on the IC device having a recess as a back chamber for the acoustic micro-sensor so as to reduce the package volume of the acoustic micro-sensor and define the back chamber volume for the acoustic micro-sensor using a conductive frame.

Figure 6:
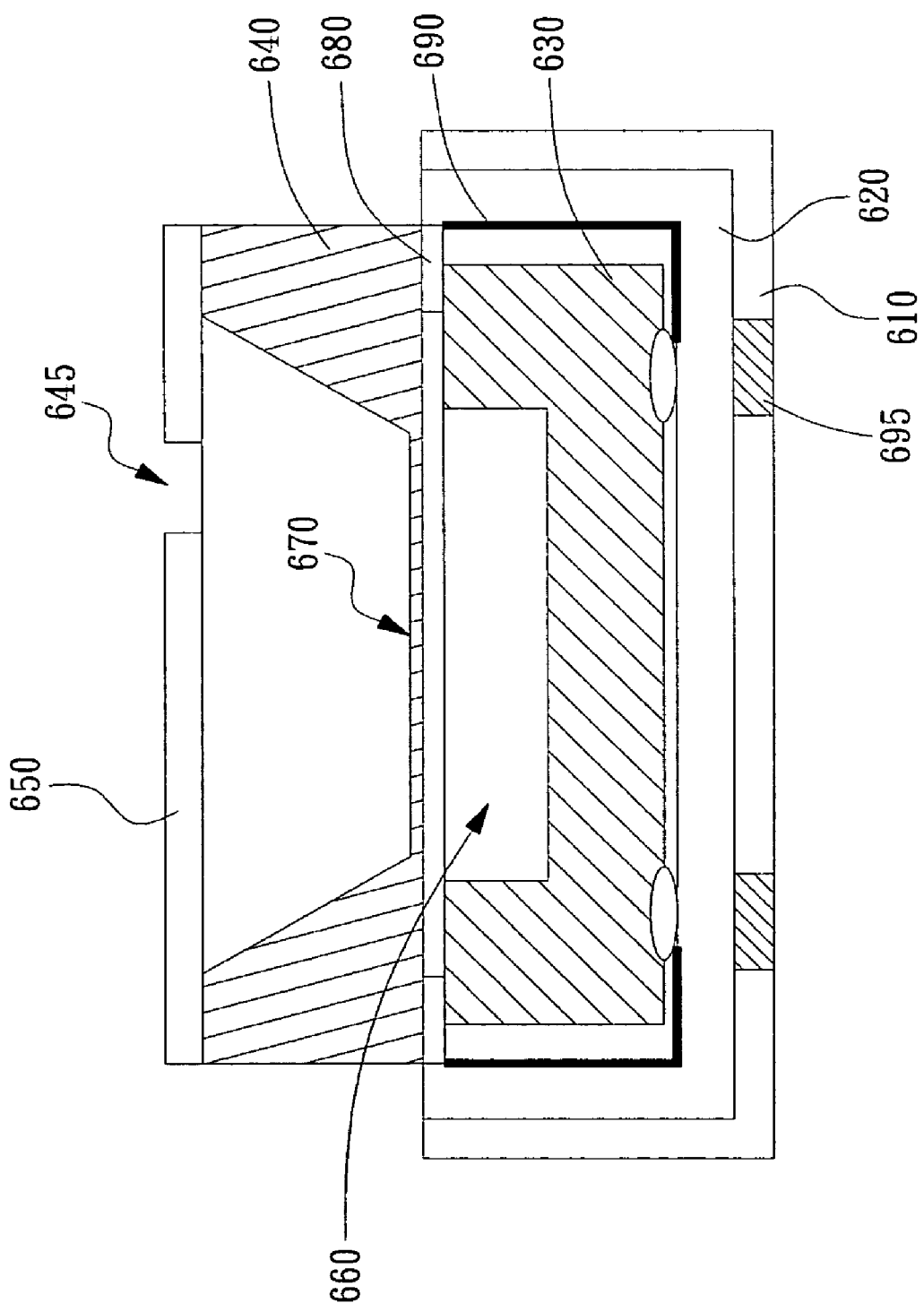
FIG. 6 is a cross-sectional diagram of a stacked package structure for reducing the package volume of an acoustic micro-sensor according to a third embodiment of the present invention.

Please refer to FIG. 6, which is a cross-sectional diagram of a stacked package structure for reducing the package volume of an acoustic micro-sensor according to a third embodiment of the present invention. In FIG. 6, the stacked package structure is similar to that in the second embodiment except that the protective substrate 610 and the conductive substrate 620 only envelop the IC device 630. Similarly, the protective substrate 410 and the conductive substrate 420 can only envelop the IC device 430.

Furthermore, in the present invention, the lid can be a glass substrate or a planar substrate. A metal material layer is deposited on each of the protective substrate and the conductive substrate so as to achieve electromagnetic shielding. The protective substrate and the conductive substrate are formed of a polymer material, a metal material or an alloy by injection molding or compression molding. The protective substrate is electrically conductive with at least a conductive wire formed thereon. The conductive substrate is a printed circuit board or a flexible printed circuit board. An adhesive or at least a solder ball is used between the conductive substrate and the IC device and between the IC device and the acoustic micro-sensor for connection. Moreover, the stacked package structure is capable of being used in a pressure sensor, an accelerometer sensor or an ultrasonic sensor.

According to the above discussion, it is apparent that the present invention discloses a stacked package structure for reducing the package volume of an acoustic micro-sensor using flip-chip technology to stack an acoustic micro-sensor on an integrated circuit (IC) device having a recess as a back chamber and cover the acoustic micro-sensor using a glass substrate or a planar substrate with an aperture so as to reduce the package volume of the acoustic micro-sensor.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A stacked package structure for reducing the package volume of an acoustic micro-sensor, comprising:
    a recessed protective substrate;
    a recessed conductive substrate, formed on the recessed protective substrate;
    an integrated circuit (IC) device, connected to the recessed conductive substrate;
    an acoustic micro-sensor, stacked on the IC device; and
    a lid having a tone hole, the lid covering the acoustic micro-sensor so that the IC device and the acoustic micro-sensor are enveloped by the lid, the protective substrate and the conductive substrate;
    wherein a recess is formed on the IC device as a back chamber of the acoustic micro-sensor.

2. The stacked package structure as recited in claim 1, wherein the lid is a glass substrate or a planar substrate.

3. The stacked package structure as recited in claim 1, wherein a metal material layer is deposited on each of the protective substrate and the conductive substrate.

4. The stacked package structure as recited in claim 1, wherein the protective substrate and the conductive substrate are formed of a polymer material, a metal material or an alloy by injection molding or compression molding.

5. The stacked package structure as recited in claim 1, wherein the protective substrate is electrically conductive with at least a conductive wire formed thereon.

6. The stacked package structure as recited in claim 1, wherein the conductive substrate is a printed circuit board or a flexible printed circuit board.

7. The stacked package structure as recited in claim 1, wherein an adhesive or at least a solder ball is used between the conductive substrate and the IC device and between the IC device and the acoustic micro-sensor for connection.

8. The stacked package structure as recited in claim 1, wherein the stacked package structure is capable of being used in a pressure sensor, an accelerometer sensor or an ultrasonic sensor.

9. A stacked package structure for reducing the package volume of an acoustic micro-sensor, comprising:
    a recessed protective substrate;
    a recessed conductive substrate, formed on the recessed protective substrate;
    an integrated circuit (IC) device, connected to the recessed conductive substrate;
    an acoustic micro-sensor, stacked on the IC device; and
    a lid having a tone hole, the lid covering the acoustic micro-sensor;
    wherein the IC device is enveloped by the protective substrate and the conductive substrate;
    wherein a recess is formed on the IC device as a back chamber of the acoustic micro-sensor.

10. A stacked package structure for reducing the package volume of an acoustic micro-sensor, comprising:
    a recessed protective substrate;
    a recessed conductive substrate, formed on the recessed protective substrate;
    an integrated circuit (IC) device, connected to the recessed conductive substrate;
    an acoustic micro-sensor, stacked on the IC device; and
    a lid having a tone hole, the lid covering the acoustic micro-sensor so that the IC device and the acoustic micro-sensor are enveloped by the lid, the protective substrate and the conductive substrate;
    wherein a recess is formed on the IC device as a back chamber of the acoustic micro-sensor, and at least a conductive frame between the IC device and the acoustic micro-sensor is formed on the sidewall of the conductive substrate to define the height and the volume of the back chamber and to electrically connect the acoustic micro-sensor and the conductive substrate.

11. The stacked package structure as recited in claim 10, wherein the lid is a glass substrate or a planar substrate.

12. The stacked package structure as recited in claim 10, wherein a metal material layer is deposited on each of the protective substrate and the conductive substrate.

13. The stacked package structure as recited in claim 10, wherein the protective substrate and the conductive substrate are formed of a polymer material, a metal material or an alloy by injection molding or compression molding.

14. The stacked package structure as recited in claim 10, wherein the protective substrate is electrically conductive with at least a conductive wire formed thereon.

15. The stacked package structure as recited in claim 10, wherein the conductive substrate is a printed circuit board or a flexible printed circuit board.

16. The stacked package structure as recited in claim 10, wherein an adhesive or at least a solder ball is used between the conductive substrate and the IC device and between the IC device and the acoustic micro-sensor for connection.

17. The stacked package structure as recited in claim 10, wherein the stacked package structure is capable of being used in a pressure sensor, an accelerometer sensor or an ultrasonic sensor.

18. A stacked package structure for reducing the package volume of an acoustic micro-sensor, comprising:

a recessed protective substrate;

a recessed conductive substrate, formed on the recessed protective substrate;

an integrated circuit (IC) device, connected to the recessed conductive substrate;

an acoustic micro-sensor, stacked on the IC device; and a lid having a tone hole, the lid covering the acoustic micro-sensor;

wherein the IC device is enveloped by the protective substrate and the conductive substrate;

wherein a recess is formed on the IC device as a back chamber of the acoustic micro-sensor, and at least a conductive frame between the IC device and the acoustic micro-sensor is formed on the sidewall of the conductive substrate to define the height and the volume of the back chamber and to electrically connect the acoustic micro-sensor and the conductive substrate.

* * * * *